United States Patent
Trakimas

(10) Patent No.: US 10,545,205 B2
(45) Date of Patent: Jan. 28, 2020

(54) VOLTAGE-MODE PASSIVE MIXER WITH INTEGRATED INPUT AND OUTPUT BUFFERS

(71) Applicant: Michael Trakimas, Cambridge, MA (US)

(72) Inventor: Michael Trakimas, Cambridge, MA (US)

(73) Assignee: WaveGuide Corporation, Cambridge, MA (US)

( * ) Notice: Subject to any disclaimer, the term of this patent is extended or adjusted under 35 U.S.C. 154(b) by 0 days.

(21) Appl. No.: 15/935,715

(22) Filed: Mar. 26, 2018

(65) Prior Publication Data

US 2018/0275230 A1    Sep. 27, 2018

Related U.S. Application Data

(60) Provisional application No. 62/476,999, filed on Mar. 27, 2017.

(51) Int. Cl.
*G01R 33/36* (2006.01)
*G01R 33/54* (2006.01)
*G01R 33/30* (2006.01)

(52) U.S. Cl.
CPC ....... *G01R 33/3621* (2013.01); *G01R 33/302* (2013.01); *G01R 33/3607* (2013.01); *G01R 33/3628* (2013.01); *G01R 33/543* (2013.01)

(58) Field of Classification Search
CPC ................................. G01R 33/3621; G01R 33/543; G01R 33/302; G01R 33/3607; G01R 33/3628; G01R 33/36; G01R 33/54; G01R 33/30
See application file for complete search history.

(56) References Cited

U.S. PATENT DOCUMENTS

| 6,160,400 | A | 12/2000 | Friedrich et al. |
| 2010/0321020 | A1 | 12/2010 | Devries et al. |
| 2013/0154635 | A1 | 6/2013 | Mandal et al. |

FOREIGN PATENT DOCUMENTS

| JP | 2005296459 A | 10/2005 |
| WO | 2015066005 A1 | 5/2015 |

OTHER PUBLICATIONS

International Search Report and Written Opinion for International Application No. PCT/US2018/024325 dated Jul. 19, 2018 11 pages.

*Primary Examiner* — Patrick Assouad
*Assistant Examiner* — Suresh K Rajaputra
(74) *Attorney, Agent, or Firm* — Morgan, Lewis & Bockius LLP

(57) ABSTRACT

Various approaches of receiving signals in integrated circuitry include implementing a voltage-mode passive mixer for down-converting the frequency of the received signals, a baseband output buffer, and a transconductance amplifier coupled between the voltage-mode passive mixer and baseband output buffer for presenting a high-impedance load to the voltage-mode passive mixer and shielding the baseband output buffer from a high-frequency feedthrough.

17 Claims, 6 Drawing Sheets

VOLTAGE-MODE PASSIVE MIXER WITH INTEGRATED INPUT AND OUTPUT BUFFERS

CROSS-REFERENCE TO RELATED APPLICATION

This application claims priority to and the benefit of, and incorporates herein by reference in its entirety, U.S. Provisional Patent Application No. 62/476,999, which was filed on Mar. 27, 2017.

FIELD OF THE INVENTION

The field of the invention relates, generally, to a sensor in integrated circuitry for receiving signals and, more particularly, to an integrated receiver in a nuclear magnetic resonance (NMR) system that allows frequency conversion of the received signals with improved performance.

BACKGROUND

An NMR system generally includes transceiver circuits for transmitting signals to a tested sample and receiving echo signals therefrom and a processor for analyzing the echo signals in order to obtain imaging and/or material information of the sample. Recently, significant efforts have been devoted to miniaturize traditional NMR systems, in particular NMR transceivers. The numerous advantages of miniaturization include low cost, portability, and the fact that a micro-coil tightly surrounding a small size sample increases the signal quality.

The practical design and construction of miniaturized NMR transceiver circuits, however, may present a number of difficulties. For example, designing an integrated mixer with sufficient power and area efficiency that also meets multiple design requirements (such as linearity, bandwidth, dynamic range, noise, gain mismatch, and offset) can be difficult. This is especially true at the lower supply voltages seen in modern semiconductor devices. If these often-conflicting design requirements are not met, the overall performance of the receiver will suffer.

For example, FIG. 1A illustrates a conventional quadrature receiver 100 including I/Q mixers 102 for down-converting the input signal to a lower frequency and generating both in-phase (I) and quadrature (Q) output signals. Down-converting the frequency of the input signal helps relax the requirements of the analog-to-digital converter (ADC) used to digitize the signal. Integrated mixers typically fall into two categories, depending on whether the mixer core circuitry is active or passive.

An exemplary active mixer is the conventional Gilbert Cell mixer 112 shown in FIG. 1B. In the Gilbert Cell mixer 112, a radio-frequency (RF) input signal is first converted to a current using the $Q_1$ devices (e.g., transistors) 114 and subsequently mixed with a local oscillator (LO) signal through the $Q_2$ devices 116. If inputs to the RF and LO ports include discrete sine waves, an intermediate frequency (IF) output across the load resistors 118 may include components at frequencies of $(f_{RF}-f_{LO})$ and $(f_{RF}+f_{LO})$. The up-converted signal at the frequency of $(f_{RF}+f_{LO})$ may be filtered using a baseband filter following the mixer 112; this leaves a desired baseband output at the frequency of $(f_{RF}-f_{LO})$. One issue with the Gilbert Cell mixer 112 is the limited headroom and poor linearity resulting from the stacked devices $Q_1$, $Q_2$, and the tail current source 120. In addition, the active mixer 112 may generate 1/f noise, which degrades the signal-to-noise ratio of the input signal when it is converted to a baseband frequency. These issues are particularly concerning in modern complementary metal-oxide-semiconductor (CMOS) processes, which have lower supply voltages and larger 1/f noise compared to bipolar devices.

On the other hand, passive mixer architectures have recently become more popular as they offer improved linearity and decreased 1/f noise compared to their active counterparts, especially in lower-voltage CMOS processes. FIG. 1C depicts a typical exemplary passive mixer architecture 132; this mixer is classified as a current-mode mixer since the transconductance stage 134 at the input converts the RF input signal into a current before it is mixed with the LO signal using mixer switches $S_1$ 136 and $S_2$ 138. The LO signal in the passive mixer 132 is a rail-to-rail square wave which turns one set of the switches 136, 138 fully on and the other set fully off based on the polarity of the signal. This feature differentiates the passive mixer 132 from the active mixer 112 that has the mixer switches biased in the active region. The output current of the passive mixer switches 136, 138 flows through feedback resistors 140 of the output transimpedance stage 142 to provide a voltage. Capacitors may be placed in parallel with the feedback resistors 140 to filter out the undesired up-converted signals.

Because stacked devices are not needed in the transconductance stage 134 (and the voltage change at the output of the transconductance stage 134 is small in the passive-current mode mixer 132), the linearity of the passive-current mode mixer 132 is generally improved compared to the Gilbert Cell mixer 112. In addition, the 1/f noise is improved in the passive-current mode mixer 132 because no direct current flows through the switches 136, 138.

The current-mode mixer architecture 132, however, cannot easily reject direct-current (DC) offsets from the transconductance stage 134 because the signal is current-mode. As a result, conventional passive current-mode mixers require complex trimming routines to inject current into one of the switching nodes that operate at RF frequencies. Further, because the gain of the current-mode mixer 132 depends on the voltage-dependent transconductance stage 134, non-linearities may still occur. In addition, it may be difficult to match mixer gains at RF frequencies without loading the preceding stage. The latter issue is a particular concern in the quadrature receiver architecture shown in FIG. 1B.

Accordingly, there is a need for an approach that allows mixers in a receiver to down-convert the received signals to baseband frequencies with improved linearity and decreased 1/f noise while avoiding mismatches in gain, bandwidth, and offset between the mixers.

SUMMARY

Embodiments of the present invention provide an approach for down-converting received signals to baseband frequencies using one or more voltage-mode passive mixers in combination with a baseband output buffer. In one implementation, the voltage-mode mixer includes a set of CMOS switches driven by source follower buffers, and the baseband output buffer includes an output transimpedance stage. This architecture keeps the received input signals in the voltage domain, thereby allowing any undesired DC offset in the mixer cores to be rejected. In addition, implementations of the voltage-mode passive mixers may simplify the design of circuitry driving the mixer switches (compared to that of circuitry driving a current-mode passive mixer in the conventional approach) and shift the design complexity to the baseband circuits following the mixers. Accordingly, embodiments of the present invention make it easier to match the gain, bandwidth, and offset between two mixers in a quadrature receiver.

In addition, in order to provide the mixer switches with the high-impedance load required by voltage-mode operation, a transconductance stage may be placed between the mixer switches and the output transimpedance stage. In one embodiment, the high-impedance load is more than one hundred times larger than the output impedance of the circuit (e.g., the source follower buffers) driving the mixer switches. Filter capacitors may also be incorporated at the output of the transconductance stage so as to filter out the up-converted signal and shield the transimpedance output buffer from high-frequency feedthrough (e.g., the a frequency of ($f_{RF}+f_{LO}$) associated with the up-converted signal described in FIG. 1B). This architecture allows a simple current digital-to-analog converter (DAC) to inject an offset trim current at a node between the transconductance and transimpedance stages. Because this node operates at a baseband frequency, the design of the trim DAC may be less complex than that in the current-mode architecture operating at much higher frequencies.

Accordingly, in one aspect, the invention pertains to a sensor for receiving signals in integrated circuitry. In various embodiments, the sensor includes a voltage-mode passive mixer for down-converting one or more frequencies of the received signals; a baseband output buffer; and a transconductance amplifier coupled to the voltage-mode passive mixer for receiving output signals therefrom and coupled to the baseband output buffer for providing input signals thereto, the transconductance amplifier presenting a high-impedance load to the voltage-mode passive mixer and shielding the baseband output buffer from a high-frequency feedthrough. In one implementation, the voltage-mode passive mixer includes multiple CMOS switches that may be driven by source followers. In addition, the voltage-mode passive mixer may include AC coupling capacitors and/or DC bias resistors for rejecting a DC offset in the voltage-mode passive mixer.

In some embodiments, the sensor further includes one or more filter capacitors, located between the voltage-mode passive mixer and the baseband output buffer, for filtering an up-converted input signal. In addition, the sensor may include a DAC for trimming an offset at an output of the baseband output buffer. In one implementation, the baseband output buffer includes a transimpedance amplifier. Further, the sensor may include one or more feedback resistors coupled to the baseband output buffer for converting the input signals from a current domain to a voltage domain.

In another aspect, the invention relates to an NMR apparatus including an NMR coil configured to enclose a sample; a receiver for receiving NMR signals from the sample, the receiver including (i) a voltage-mode passive mixer for down-converting a frequency of the received NMR signals, (ii) a baseband output buffer, and (iii) a transconductance amplifier coupled to the voltage-mode passive mixer for receiving output signals therefrom and coupled to the baseband output buffer for providing input signals thereto, the transconductance amplifier presenting a high-impedance load to the voltage-mode mixer and shielding the baseband output buffer from a high-frequency feedthrough; and a controller configured to analyze the received NMR signals.

In some embodiments, the voltage-mode passive mixer includes multiple CMOS switches that may be driven by source followers. In addition, the voltage-mode passive mixer may include AC coupling capacitors and/or DC bias resistors for rejecting a DC offset in the voltage-mode passive mixer. In one embodiment, the NMR apparatus further includes one or more filter capacitors, located between the voltage-mode passive mixer and the baseband output buffer, for filtering an up-converted input signal. In addition, the NMR apparatus may include a DAC for trimming an offset at an output of the baseband output buffer. In one implementation, the baseband output buffer includes a transimpedance amplifier. Further, the NMR apparatus may include one or more feedback resistors coupled to the baseband output buffer for converting the input signals from a current domain to a voltage domain.

Another aspect of the invention relates to a method of receiving signals in integrated circuitry. In various embodiments, the method includes providing a frequency-conversion means for down-converting a frequency of the received signals; providing the first amplification means for converting the signals from a current domain to the voltage domain; and providing the second amplification means coupled to the frequency-conversion means for receiving output signals therefrom and coupled to the first amplification means for providing input signals thereto; the second amplification means presents a high-impedance load to the frequency-conversion means and shielding the first amplification means from a high-frequency feedthrough.

Reference throughout this specification to "one example," "an example," "one embodiment," or "an embodiment" means that a particular feature, structure, or characteristic described in connection with the example is included in at least one example of the present technology. Thus, the occurrences of the phrases "in one example," "in an example," "one embodiment," or "an embodiment" in various places throughout this specification are not necessarily all referring to the same example. Furthermore, the particular features, structures, routines, steps, or characteristics may be combined in any suitable manner in one or more examples of the technology. The headings provided herein are for convenience only and are not intended to limit or interpret the scope or meaning of the claimed technology.

BRIEF DESCRIPTION OF THE DRAWINGS

In the drawings, like reference characters generally refer to the same parts throughout the different views. Also, the drawings are not necessarily to scale, with an emphasis instead generally being placed upon illustrating the principles of the invention. In the following description, various embodiments of the present invention are described with reference to the following drawings, in which.

DETAILED DESCRIPTION

Figure 2A:
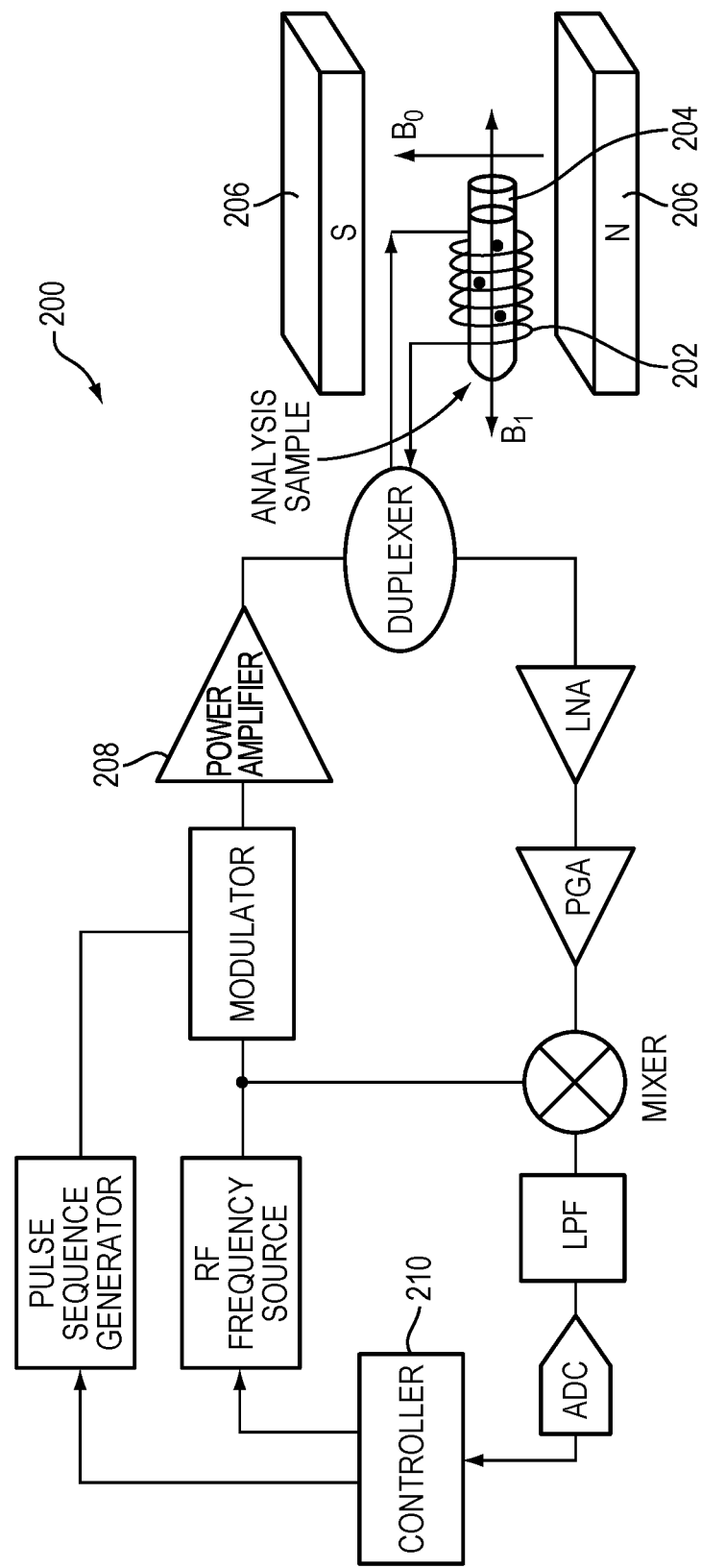
FIGS. 2A-2C schematically illustrate an exemplary NMR system in accordance with various embodiments.
Figure 2B:
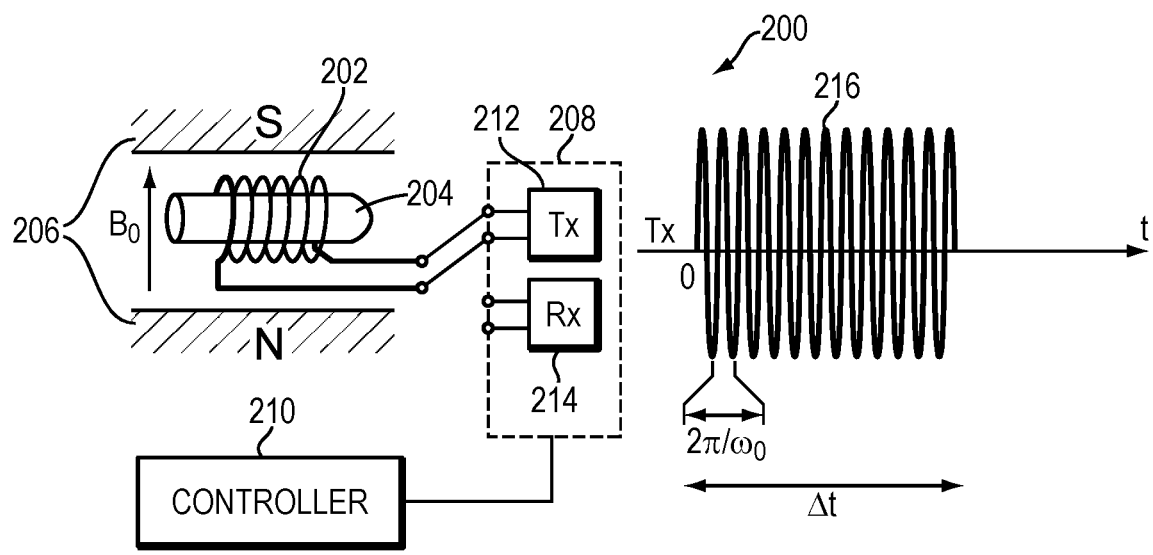

A sensor generally detects events or changes in its environment and sends the information to other electronics for analysis. For example, an NMR system may include an RF receiver to detect echo signals from a sample and subsequently transmit the signals to a processor for analyzing imaging and/or material information of the sample. FIG. 2A illustrates an exemplary NMR system 200 in accordance with various embodiments of the present invention. The system 200 includes an NMR coil 202 surrounding a sample 204 being analyzed, a magnet 206 for generating a static magnetic field across the sample 204 and the coil 202, an RF transceiver 208 coupled to the NMR coil 202, and a controller 210 for controlling operation of the RF transceiver 208. In one implementation, with reference to FIGS. 2B and 2C, the transceiver 208 includes a transmitter (Tx) portion 212 for generating and transmitting RF signals to the sample 204 and a receiver (Rx) portion 214 for receiving echo signals from the sample 204.

During NMR measurements, the magnet 206 is activated to generate a substantially homogeneous magnetic field $B_0$ (e.g., within 0.1 parts per million (ppm) or, in some embodiments, within 100 ppm) across the sample 204; individual magnetic moments of the spins in the sample 204 may attempt to align with the applied field $B_0$. As a result, the magnetic moments of all the nuclei in the sample sum to a net magnetic moment that precesses about the axis of the field $B_0$ at a characteristic Larmor frequency, $\omega_0$, satisfying $\omega_0 = \gamma B_0$, where $\gamma$ is a gyromagnetic ratio. Because different nuclei have different values of the gyromagnetic ratio, measuring the Larmor frequency of the sample 204 allows material properties (e.g., the chemical composition) of the sample 204 to be revealed. In various embodiments, to observe precession of the net magnetic moment, the controller 210 causes the transmitter 212 to transmit an RF signal 216 (typically comprising a pulse sequence) having a resonant frequency substantially close (e.g., within ±1%) to the Larmor frequency $\omega_0$ to the coil 202; the coil 202 then generates an RF magnetic field that causes the net magnetic moment of the nuclei in the sample 204 to be "tipped" away from the axis of the static field $B_0$. Typically, the RF magnetic field has a time-dependent magnitude and is generated in a plane perpendicular to the axis of the static field $B_0$.

Figure 2C:
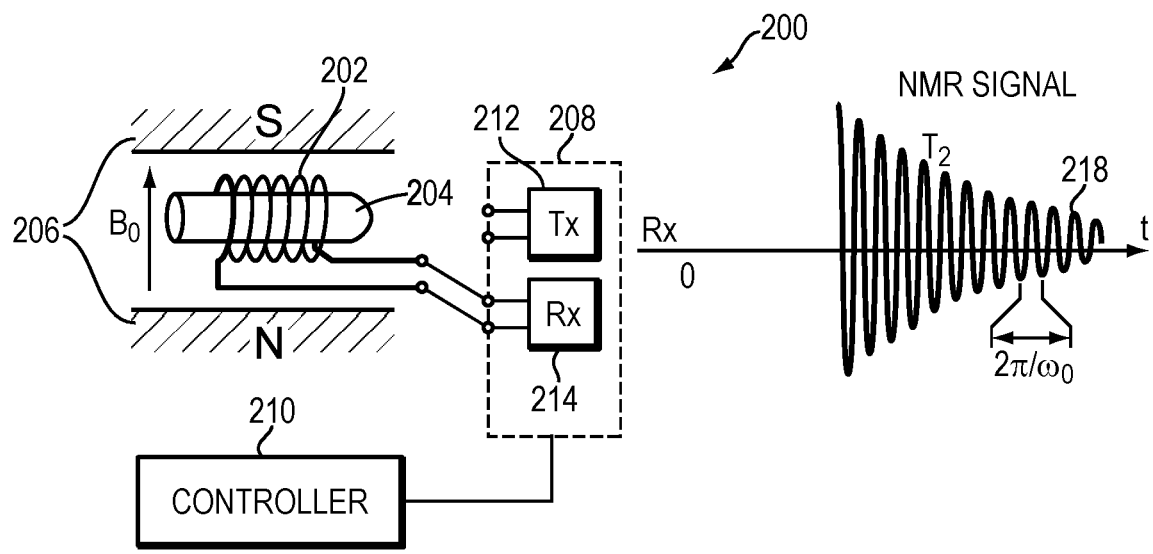

Referring to FIG. 2C, after a predetermined time duration, $\Delta t$, the transmitter 212 stops transmission of the RF excitation signal 216, and the coil 202 is switched via, for example, a mechanical or electrical switch (e.g., a transistor) to the receiver 214 for receiving the echo signals from the sample 204. Upon stopping the RF excitation, the nuclear spins within the sample 204 precess around the $B_0$-axis at the Larmor frequency $\omega_0$; this induces a corresponding signal oscillation. The nuclear spins then slowly lose phase coherence via spin-spin interactions, which manifest themselves in a macroscopic average as an exponential relaxation or damping signal 218 (referred to as "free induction decay") in the precession of the net magnetic moment. The oscillation and relaxation of the NMR signal can be detected by the coil 202. Because the spin-spin interactions are peculiar to the material of the sample 204 being tested, the characteristic time, commonly referred to as $T_2$, of the relaxation signal is also material-specific. Thus, by measuring the Larmor frequency $\omega_0$ (e.g., for spectroscopy) and/or characteristic time $T_2$ (e.g., for relaxometry), NMR techniques can be used as an analytic tool in a number of fields, including but not limited to chemical composition analysis, medical imaging, and bio-sensing. An exemplary NMR system is described in U.S. Pat. No. 8,643,368, the entire disclosure of which is hereby incorporated by reference.

Figure 3:
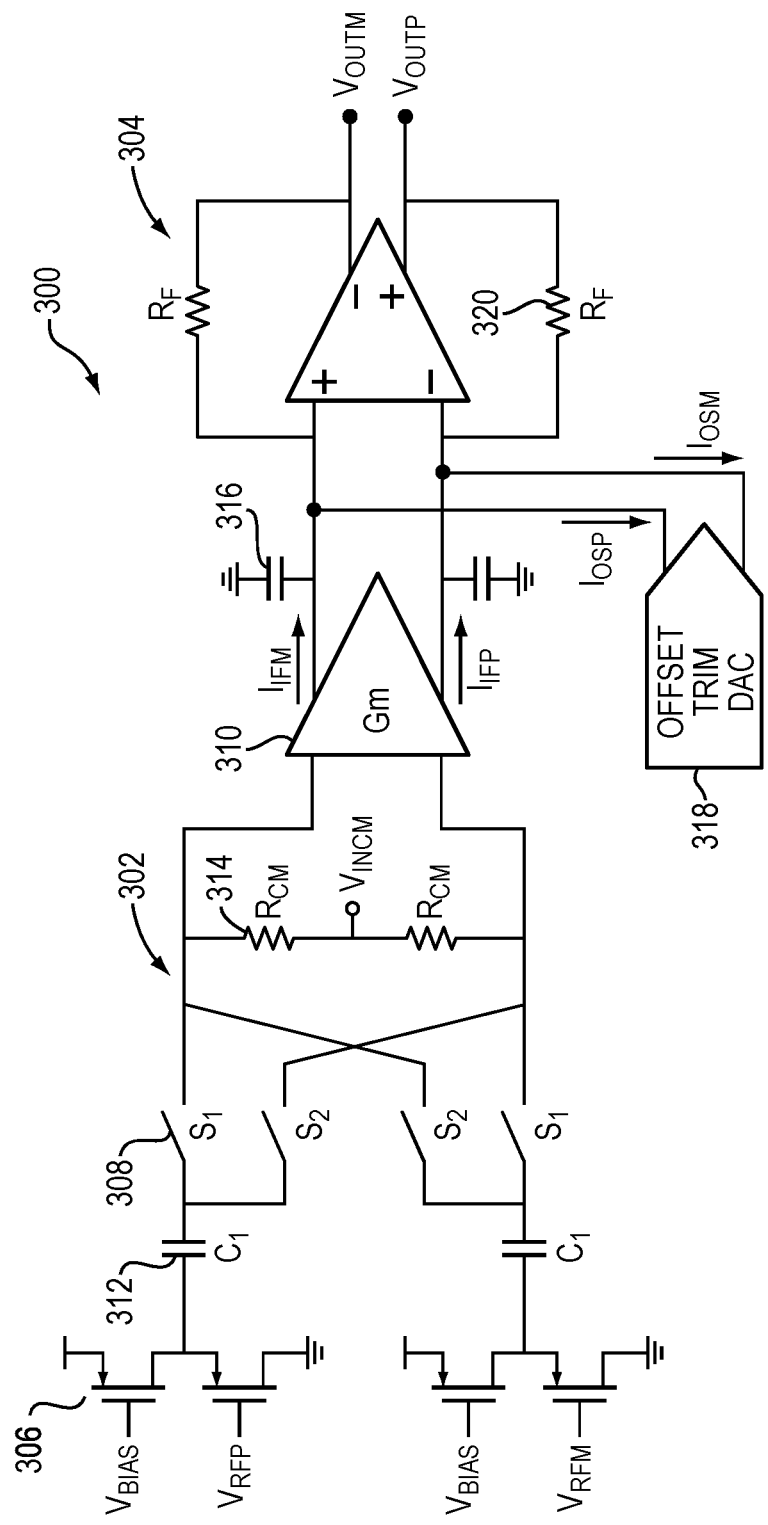
FIG. 3 depicts exemplary circuitry implemented in a sensor/receiver in accordance with various embodiments.

In NMR applications, frequencies of the received RF signals are typically down-converted to lower baseband frequencies in order to relax the ADC requirements for digitizing the signals for further processing. In various embodiments, with reference to FIG. 3, the frequency conversion is achieved using a circuit 300 including one or more voltage-mode passive mixers 302 in combination with a baseband output buffer 304 (e.g., a transimpedance output buffer). In one implementation, the voltage-mode passive mixer 302 includes source follower buffers 306 providing an input signal (e.g., a received RF signal) to a plurality of mixer switches 308, which may be driven by a rail-to-rail, square-wave LO signal. In addition, the receiver/sensor circuit 300 may include a transconductance (Gm) stage 310; the LO signal may then switch the polarity of the input signal at the input of the transconductance stage 310 based on a polarity of the input signal. The transconductance stage 310 may effectively shield the mixer switches 308 from the transimpedance output buffer 304 and provide a high-impedance load to the mixer switches 308, thereby avoiding degradation of the gain and linearity of the voltage-mode signal. In addition, because the received signal remains in the voltage mode, alternating-current (AC) coupling capacitors 312 ($C_1$) and DC bias resistors 314 ($R_{CM}$) may be used in the receiver circuit 300 to effectively reject any undesired DC offset in the mixer 302, thereby optimizing the input bias at the transconductance stage 310. Accordingly, the design complexity of circuitry driving the mixer switches 308 can be simplified in accordance with various embodiments of the present invention. For example, as illustrated in FIG. 3, in one implementation, the driving circuitry can simply be the source followers 306.

In various embodiments, the circuit 300 further includes capacitors 316 placed after the transconductance stage 310 in order to filter out the up-converted input signal. This approach also shields the transimpedance output buffer 304 from high-frequency feedthrough, thereby allowing its bandwidth to be greatly decreased. In the absence of the filter capacitors 316, any signal above the bandwidth of the amplifier in the transimpedance stage 304 may not "see" an AC ground at the input of the transimpedance stage 304, resulting in degraded linearity. In addition, because the input to the transimpedance output buffer 304 operates at a baseband frequency, a simple current DAC 318 may be incorporated to trim the output offset. Implementation of the DAC 318 is a simpler approach compared to the complex trimming routines or circuitry used in a conventional current-mode architecture where an offset trim current is injected into one of the switching nodes that operate at much higher frequencies. Further, the overall offset that needs to be trimmed in various embodiments of the current invention may be much less, since any offset in the mixer itself is rejected by the AC coupling capacitors 312 already and bigger devices may be used in the baseband circuits to reduce their offset and any mismatch.

Figure 1A:
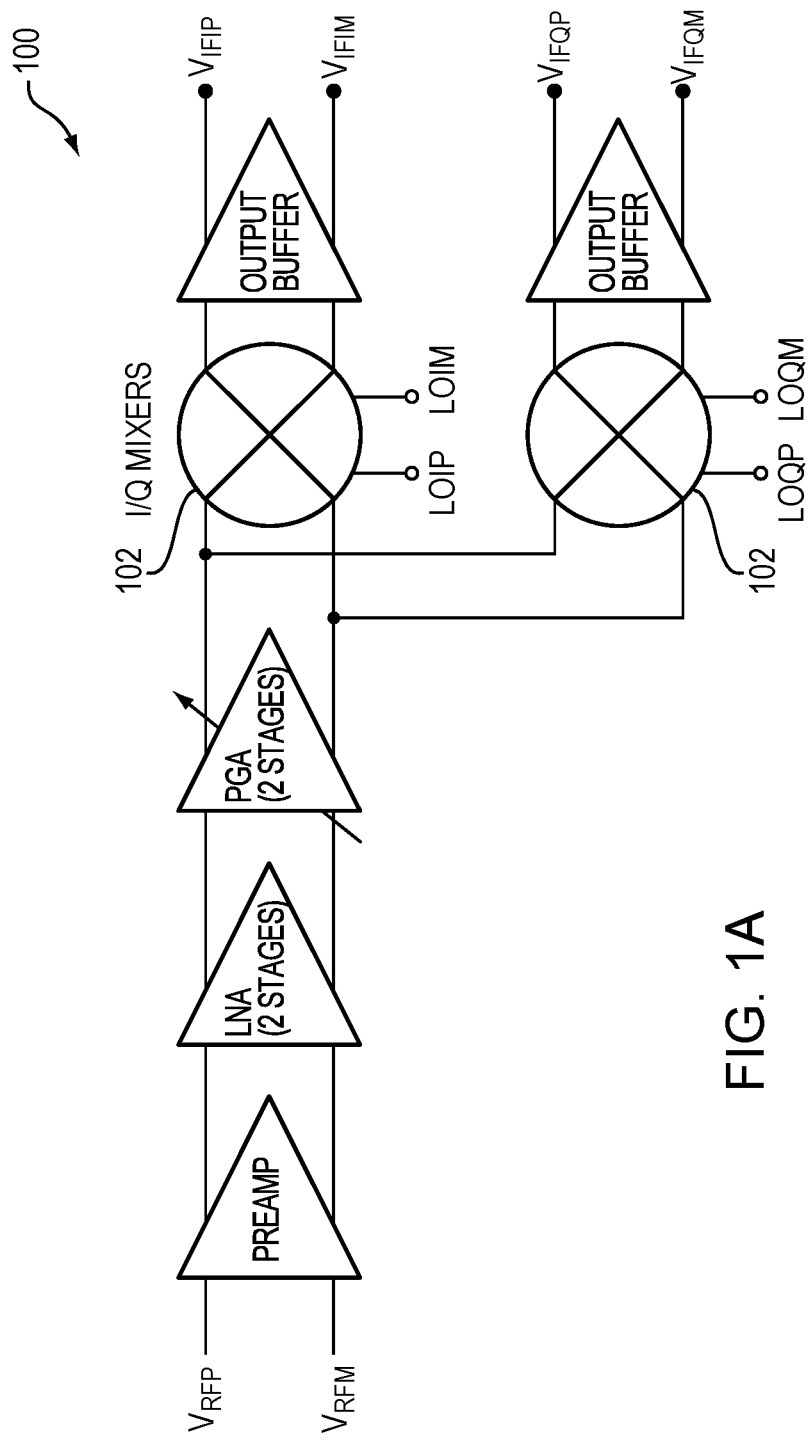
FIG. 1A schematically illustrates an architecture of a quadrature receiver in accordance with the prior art.
Figure 1B:
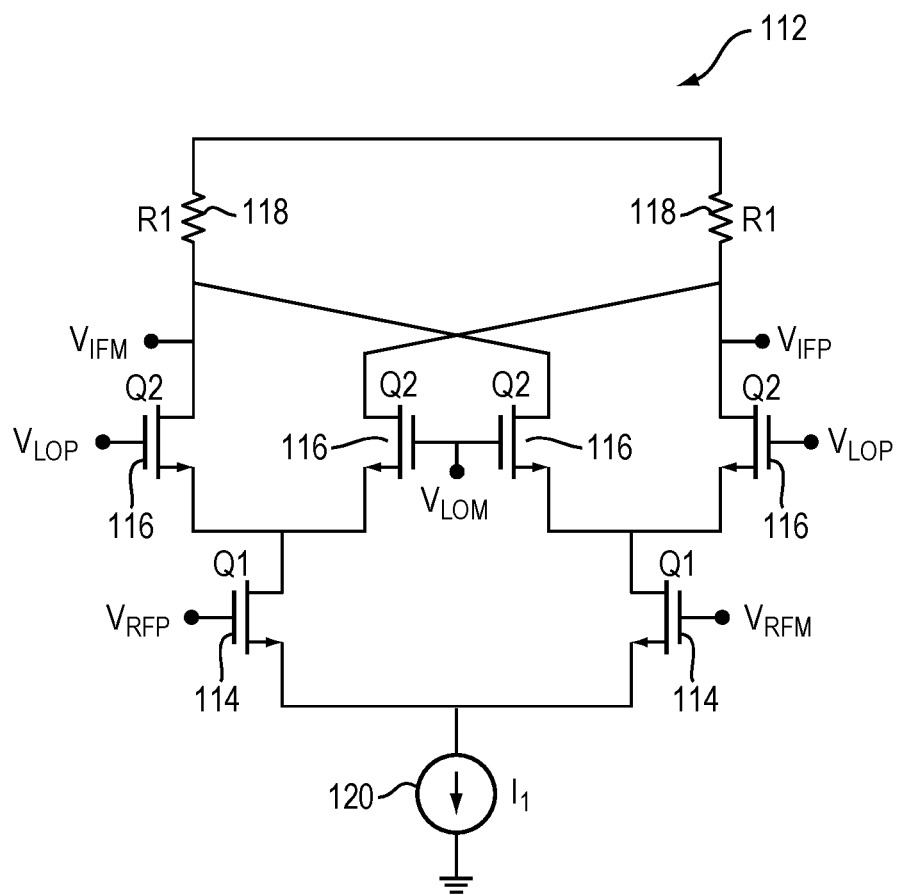
FIGS. 1B and 1C schematically illustrate architectures of an active mixer and a passive mixer, respectively, in accordance with the prior art.
Figure 1C:
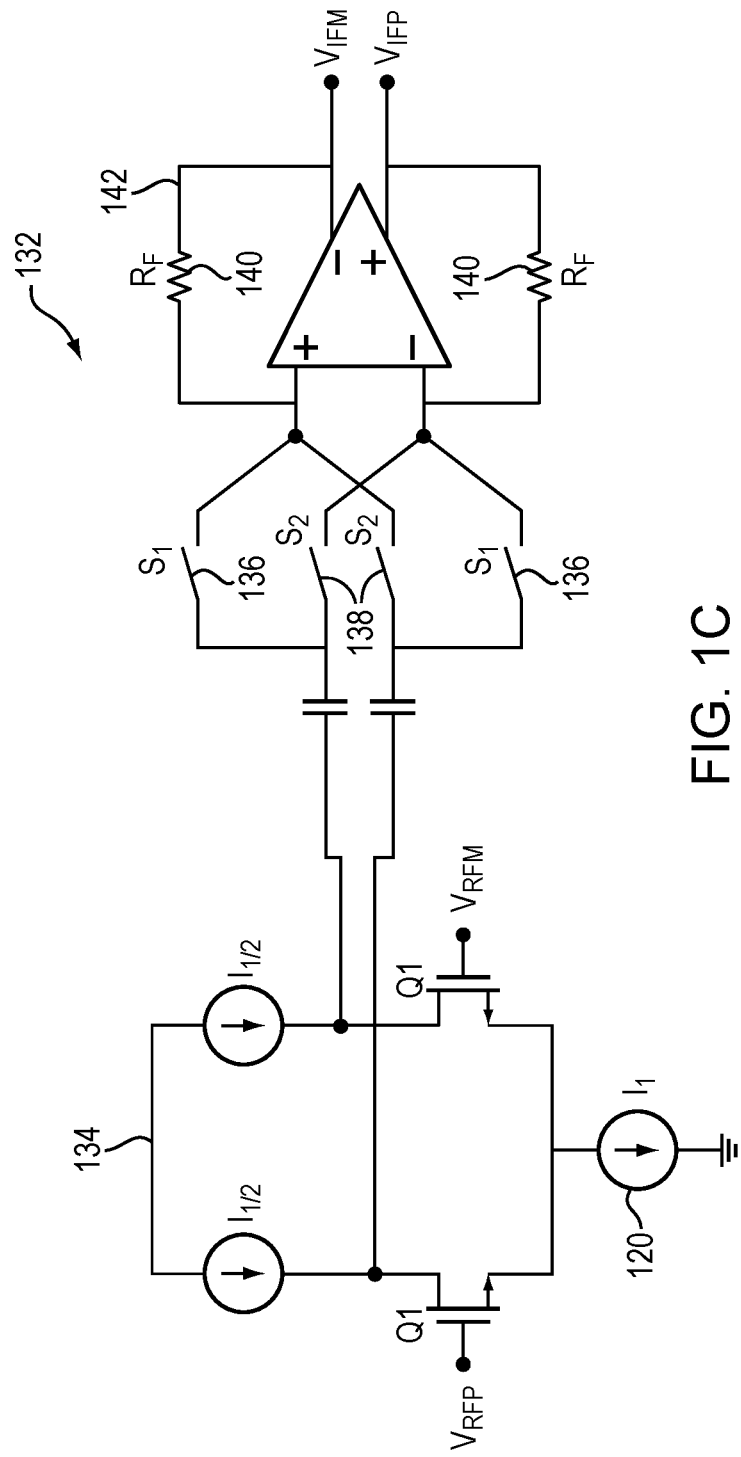

In some embodiments, feedback resistors 320 are added around the transimpedance output buffer 304 in order to convert signals from the current domain back to the voltage domain. Shielding the transimpedance output buffer 304 from any high-frequency feedthrough greatly simplifies its design compared to that used in conventional current-mode architectures. In addition, implementation of the circuit 300 described herein in a receiver/sensor advantageously allows the transimpedance amplifier that sets the gain of the mixer and output buffer to come after the mixer and operate at a baseband frequency. Therefore, utilization of the circuit 300 in the conventional quadrature receiver (shown in FIG. 1A) may simplify gain matching between two voltage-mode mixers 202 compared to the approach implemented for matching gains between two current-mode mixers.

Accordingly, embodiments of the present invention provide a circuit architecture combining a voltage-mode passive mixer 302 and a baseband output buffer 304 for down-converting received high-frequency signals to baseband frequencies. The core of the voltage-mode mixer 302 may include a set of CMOS switches 308 driven by source follower buffers 306. A transconductance stage 310 and filter capacitors 316 may be strategically placed between the output of the mixer switches 308 and the baseband transimpedance output buffer 304 to provide a high-impedance load to the voltage-mode mixer switches 308 and shield the transimpedance output buffer 304 from high-frequency feedthrough. Compared with conventional mixer architectures, the circuit architecture disclosed herein advantageously shifts most of the design burden from the RF domain to the baseband domain; as a result, a simpler and more power efficient design is achieved.

It should be noted that although the circuitry implementation shown in FIG. 3 is fully differential, it may alternatively be single-ended. In addition, embodiments of the current invention are not limited to implementations in RF receivers and may be used to implement the mixer in numerous analog front-end structures employed in various types of sensors. Further, NMR is an exemplary application that may benefit from implementing the frequency down-converting architecture; one of ordinary skill in the art will understand that many suitable applications may benefit from the sensor/receiver architecture described herein and are thus within the scope of the invention.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A sensor for receiving signals in integrated circuitry, the sensor comprising:
    a voltage-mode passive mixer for down-converting one or more frequencies of the received signals;
    a baseband output buffer; and
    a transconductance amplifier coupled to the voltage-mode passive mixer for receiving output signals therefrom and coupled to the baseband output buffer for providing input signals thereto, the transconductance amplifier presenting a high-impedance load to the voltage-mode passive mixer and shielding the baseband output buffer from a high-frequency feedthrough.

2. The sensor of claim 1, wherein the voltage-mode passive mixer comprises a plurality of CMOS switches.

3. The sensor of claim 2, wherein the voltage-mode passive mixer comprises source followers for driving the CMOS switches.

4. The sensor of claim 3, wherein the voltage-mode passive mixer comprises at least one of AC coupling capacitors or DC bias resistors for rejecting a DC offset in the voltage-mode passive mixer.

5. The sensor of claim 1, further comprising one or more filter capacitors, located between the voltage-mode passive mixer and the baseband output buffer, for filtering an up-converted input signal.

6. The sensor of claim 1, further comprising a DAC for trimming an offset at an output of the baseband output buffer.

7. The sensor of claim 1, wherein the baseband output buffer comprises a transimpedance amplifier.

8. The sensor of claim 1, further comprising one or more feedback resistors coupled to the baseband output buffer for converting the input signals from a current domain to a voltage domain.

9. An NMR apparatus comprising:
    an NMR coil configured to enclose a sample;
        a receiver for receiving NMR signals from the sample, the receiver comprising (i) a voltage-mode passive mixer for down-converting a frequency of the received NMR signals, (ii) a baseband output buffer, and (iii) a transconductance amplifier coupled to the voltage-mode passive mixer for receiving output signals therefrom and coupled to the baseband output buffer for providing input signals thereto, the transconductance amplifier presenting a high-impedance load to the voltage-mode mixer and shielding the baseband output buffer from a high-frequency feedthrough; and
        a controller configured to analyze the received NMR signals.

10. The NMR apparatus of claim 9, wherein the voltage-mode passive mixer comprises a plurality of CMOS switches.

11. The NMR apparatus of claim 10, wherein the voltage-mode passive mixer comprises source followers for driving the CMOS switches.

12. The NMR apparatus of claim 11, wherein the voltage-mode passive mixer comprises at least one of AC coupling capacitors or DC bias resistors for rejecting a DC offset in the voltage-mode passive mixer.

13. The NMR apparatus of claim 9, further comprising one or more filter capacitors, located between the voltage-mode passive mixer and the baseband output buffer, for filtering an up-converted input signal.

14. The NMR apparatus of claim 9, further comprising a DAC for trimming an offset at an output of the baseband output buffer.

15. The NMR apparatus of claim 9, wherein the baseband output buffer comprises a transimpedance amplifier.

16. The NMR apparatus of claim 9, further comprising one or more feedback resistors coupled to the baseband output buffer for converting the input signals from a current domain to a voltage domain.

17. A method of receiving signals in integrated circuitry, the method comprising:
    providing a frequency-conversion means for down-converting a frequency of the received signals;
    providing a first amplification means for converting the signals from a current domain to the voltage domain; and
    providing a second amplification means coupled to the frequency-conversion means for receiving output signals therefrom and coupled to the first amplification means for providing input signals thereto, the second amplification means presenting a high-impedance load to the frequency-conversion means and shielding the first amplification means from a high-frequency feedthrough.

* * * * *